(12) United States Patent
Chen

(10) Patent No.: US 8,582,276 B2
(45) Date of Patent: Nov. 12, 2013

(54) CAPACITOR STRUCTURE

(75) Inventor: Chien-Sheng Chen, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 103 days.

(21) Appl. No.: 13/414,725

(22) Filed: Mar. 8, 2012

(65) Prior Publication Data

US 2013/0148258 A1 Jun. 13, 2013

(30) Foreign Application Priority Data

Dec. 7, 2011 (TW) .............................. 100145073 A

(51) Int. Cl.
*H01G 4/005* (2006.01)
*H01G 4/00* (2006.01)

(52) U.S. Cl.
USPC .................. 361/303; 361/301.1; 361/302

(58) Field of Classification Search
None
See application file for complete search history.

(56) References Cited

U.S. PATENT DOCUMENTS

| | | | | |
|---|---|---|---|---|
| 7,022,581 | B2 * | 4/2006 | Harris et al. | 438/396 |
| 8,039,923 | B2 * | 10/2011 | Harris et al. | 257/532 |
| 2010/0061036 | A1 * | 3/2010 | Harris et al. | 361/303 |
| 2010/0315758 | A1 * | 12/2010 | Chen | 361/301.1 |

* cited by examiner

*Primary Examiner* — Jayprakash N Gandhi
*Assistant Examiner* — Dion Ferguson
(74) *Attorney, Agent, or Firm* — Jianq Chyun IP Office

(57) ABSTRACT

A capacitor structure including a dielectric material layer and at least two metal layers is provided. The metal layers are disposed at intervals in the dielectric material layer. Each of the metal layers includes a zigzaging electrode, a first finger-shaped electrode and a second finger-shaped electrode. The zigzaging electrode forms a plurality of first concave parts disposed at one side of the zigzaging electrode and a plurality of second concave parts disposed at the other side of the zigzaging electrode. The first finger-shaped electrode includes a plurality of first extension parts. The first extension parts are respectively disposed in the first concave parts. The second finger-shaped electrode includes a plurality of second extension parts. The second extension parts are respectively disposed in the second concave parts. The zigzaging electrode in each of the metal layers is electrically coupled to the first and second finger-shaped electrodes of adjacent metal layers.

20 Claims, 4 Drawing Sheets

CAPACITOR STRUCTURE

CROSS-REFERENCE TO RELATED APPLICATION

This application claims the priority benefit of Taiwan application serial no. 100145073, filed on Dec. 7, 2011. The entirety of the above-mentioned patent application is hereby incorporated by reference herein and made a part of this specification.

BACKGROUND OF THE INVENTION

1. Field of the Invention

The invention relates to a capacitor structure, and more particularly to a metal-oxide-metal (MOM) capacitor structure.

2. Description of Related Art

Capacitors are essential and fundamental devices in the current semiconductor industry. The metal-oxide-metal (MOM) capacitor is a common capacitor structure and has a basic design of filling an insulating medium between the metal plates adopted as electrodes, such that a capacitor unit is formed between every two adjacent metal plates and the insulating medium therebetween.

Since the capacitance of the MOM capacitor is positively proportional to the area of the electrode and inversely proportional to the distance between two electrodes, the capacitance can be increased by reducing the thickness of the insulating medium between the electrodes, or increasing the surface area of the electrodes, and so on in the design of the capacitor structure.

The methods of increasing the surface area of the electrodes include a multi-layer capacitor structure which adopts multiple layers of metal electrodes to increase the surface area of the electrodes. However, the uniformity of the medium layer, complicated fabrication steps, and the stability of the fabrication are difficult to control.

With the demands for miniaturizing semiconductors, the integration of the integrated circuits is becoming higher. Therefore, researches have been conducted to improve the capacitor structure for increasing the capacitance in a unit area of the capacitor structure under the current fabrication specification. In order to increase the capacitance in the unit area of the capacitor structure effectively, an optimal capacitor structure design has to be introduced.

SUMMARY OF THE INVENTION

The invention is directed to a capacitor structure capable of increasing the capacitance of a unit area and optimizing the total capacitance.

The invention is directed to a capacitor structure including a dielectric material layer and at least two metal layers. The two metal layers are disposed at intervals in the dielectric material layer. Each of the metal layers includes a zigzaging electrode, a first finger-shaped electrode, and a second finger-shaped electrode. The zigzaging electrode forms a plurality of first concave parts and a plurality of second concave parts. The first concave parts are disposed at one side of the zigzaging electrode and the second concave parts are disposed at the other side of the zigzaging electrode. The first finger-shaped electrode includes a plurality of first extension parts disposed in the first concave parts respectively. The second finger-shaped electrode includes a plurality of second extension parts disposed in the second concave parts respectively. The zigzaging electrode in each of the metal layers is electrically connected to the first finger-shaped electrode in an adjacent metal layer and the second finger-shaped electrode in the adjacent metal layer.

The invention is further directed to a capacitor structure including a dielectric material layer, a first metal layer, and a second metal layer. The first metal layer is disposed in the dielectric material layer. The first metal layer includes a first zigzaging electrode, a first finger-shaped electrode, and a second finger-shaped electrode. The first zigzaging electrode forms a plurality of first concave parts and a plurality of second concave parts. The first concave parts are disposed at one side of the first zigzaging electrode and the second concave parts are disposed at the other side of the first zigzaging electrode. The first finger-shaped electrode includes a plurality of first extension parts disposed in the first concave parts respectively. The second finger-shaped electrode includes a plurality of second extension parts disposed in the second concave parts respectively. The second metal layer is disposed at intervals with the first metal layer in the dielectric material layer. The second metal layer includes a second zigzaging electrode, a third finger-shaped electrode, and a fourth finger-shaped electrode. The second zigzaging electrode forms a plurality of third concave parts disposed at one side of the second zigzaging electrode and a plurality of fourth concave parts disposed at the other side of the second zigzaging electrode. The third finger-shaped electrode includes a plurality of third extension parts disposed in the third concave parts respectively. The fourth finger-shaped electrode includes a plurality of fourth extension parts disposed in the fourth concave parts respectively. The first zigzaging electrode is electrically connected to the third finger-shaped electrode and the fourth finger-shaped electrode. The second zigzaging electrode is electrically connected to the first finger-shaped electrode and the second finger-shaped electrode.

In light of the foregoing, the invention provides a capacitor structure capable of increasing the capacitance of the unit area and optimizing the total capacitance. The capacitor structure of the invention has a lower area cost in the layout of the integrated circuit.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

Figure 1A:
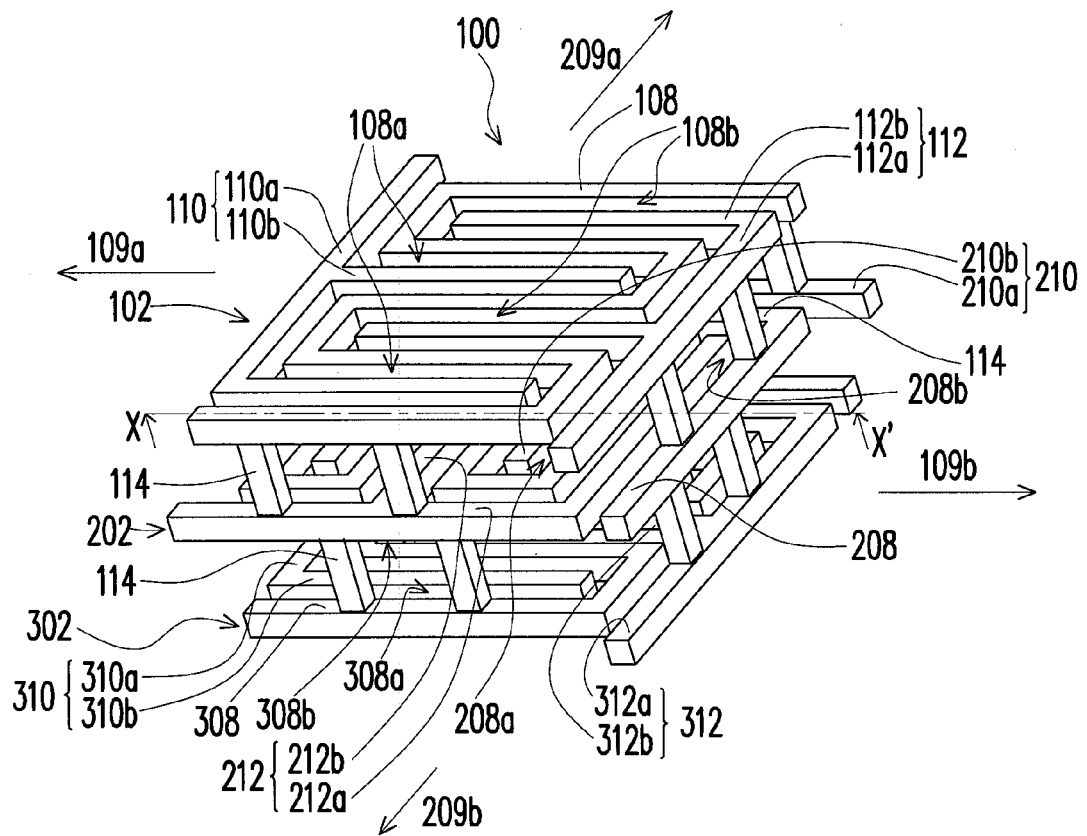
FIG. 1A is a schematic diagram illustrating a capacitor structure according to one embodiment of the invention.

Attached drawings are provided to further illustrate the embodiments of the invention in the following. However, the invention can be implemented in different manners and is not limited to the embodiments described below. Moreover, the sizes and the relative sizes of the layers and the devices may be exaggerated for better illustration in the drawings. In the following, "substantially" means that "tolerable deviation" also falls within the scope of the invention.

Figure 1B:
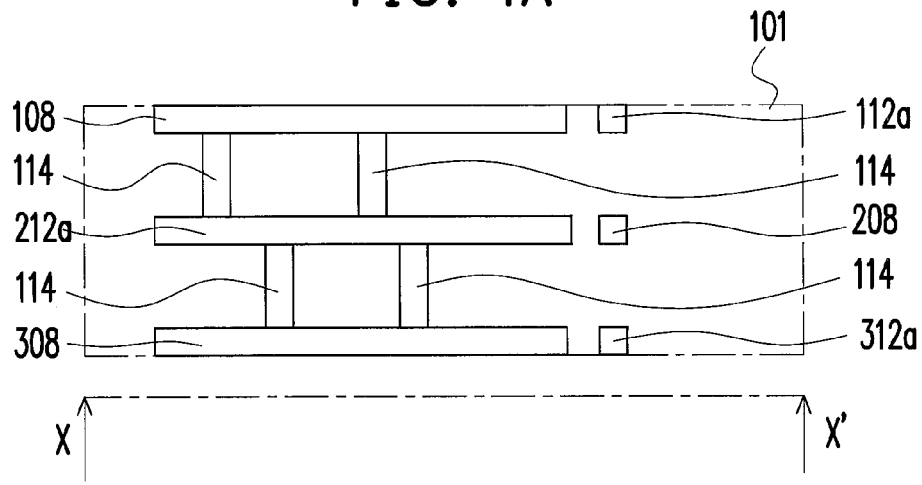
FIG. 1B shows a cross-sectional view of the capacitor structure in FIG. 1A taken along line X-X'.

FIG. 1A is a schematic diagram illustrating a capacitor structure according to one embodiment of the invention. FIG. 1B shows a cross-sectional view of the capacitor structure in FIG. 1A taken along line X-X'.

Firstly, referring to FIGS. 1A and 1B, a capacitor structure 100 includes a dielectric material layer 101 (not shown in FIG. 1A, but shown in FIG. 1B), a first metal layer 102, a second metal layer 202, and a third metal layer 302. The dielectric material layer 101 may be a single-layer or multi-layer dielectric structure with an oxide insulation layer, where a material thereof includes, silicon dioxide ($SiO_2$) or aluminum oxide ($Al_2O_3$), for example. The multi-layer dielectric structure above-mentioned means the dielectric material layer 101 is a dielectric structure comprising various kinds of dielectric materials. The first metal layer 102, the second metal layer 202, and the third metal layer 302 are disposed at intervals in the dielectric material layer 101. In the embodiment, a capacitor structure having three layers of metal layers is used as an example. However, the invention is not limited thereto, a capacitor structure falls within the scope of the invention as long as the capacitor structure includes at least two layers of metal layers. For better illustration, the dielectric material layer 101 is not shown in FIG. 1A.

As illustrated in FIG. 1A, the first metal layer 102 includes a first zigzagging electrode 108, a first finger-shaped electrode 110, and a second finger-shaped electrode 112. On a plane that is orthogonal to the normal direction of the first metal layer 102, the first zigzaging electrode 108 forms a plurality of first concave parts 108a and a plurality of second concave parts 108b in a zigzaging manner. The first concave parts 108a are disposed at one side of the first zigzaging electrode 108. The second concave parts 108b are disposed at the other side of the first zigzaging electrode 108. The opening direction of each of the first concave parts 108a is along a first direction 109a. The opening direction of each of the second concave parts 108b is along a second direction 109b which is opposite to the first direction 109a. The first finger-shaped electrode 110 includes a plurality of first extension parts 110b disposed in the first concave parts 108a respectively. The second finger-shaped electrode 112 includes a plurality of second extension parts 112b disposed in the second concave parts 108b respectively. Moreover, the first finger-shaped electrode 110 further includes a first base 110a. The first extension parts 110b connect to the first base 110a. The second finger-shaped electrode 112 further includes a second base 112a. The second extension parts 112b connect to the second base 112a. In one embodiment, a material of the first metal layer 102 includes, for instance, copper or aluminum.

The second metal layer 202 includes a second zigzaging electrode 208, a third finger-shaped electrode 210, and a fourth finger-shaped electrode 212. On a plane that is orthogonal to the normal direction of the second metal layer 202, the second zigzaging electrode 208 forms a plurality of third concave parts 208a and a plurality of fourth concave parts 208b in a zigzaging manner. The third concave parts 208a are disposed at one side of the second zigzaging electrode 208. The fourth concave parts 208b are disposed at the other side of the second zigzaging electrode 208. An opening direction of each of the third concave parts 208a is along a third direction 209a. An opening direction of each of the fourth concave parts 208b is along a fourth direction 209b which is opposite to the third direction 209a. In one embodiment, an included angle defined by the third direction 209a and the first direction 109a is equal to 90 degrees, for example. However, the invention is not limited thereto. In other embodiments, the included angle defined by the third direction 209a and the first direction 109a could be larger than 0 degree and smaller than 180 degrees. The third finger-shaped electrode 210 includes a plurality of third extension parts 210b disposed in the third concave parts 208a respectively. The fourth finger-shaped electrode 212 includes a plurality of fourth extension parts 212b disposed in the fourth concave parts 208b respectively. Moreover, the third finger-shaped electrode 210 further includes a third base 210a. The third extension parts 210b connect to the third base 210a. The fourth finger-shaped electrode 212 further includes a fourth base 212a. The fourth extension parts 212b connect to the fourth base 212a. In one embodiment, a material of the second metal layer 202 includes, for instance, copper or aluminum.

The third metal layer 302 includes a third zigzaging electrode 308, a fifth finger-shaped electrode 310, and a sixth finger-shaped electrode 312. On a plane that is orthogonal to the normal direction of the third metal layer 302, the third zigzaging electrode 308 forms a plurality of fifth concave parts 308a and a plurality of sixth concave parts 308b in a zigzaging manner. The fifth concave parts 308a are disposed at one side of the third zigzaging electrode 308. The sixth concave parts 308b are disposed at the other side of the third zigzaging electrode 308. Similar to the first concave parts 108a, an opening direction of each of the fifth concave parts 308a is along the first direction 109a. Similar to the second concave parts 108b, an opening direction of each of the sixth concave parts 308b is along the second direction 109b. Nonetheless, the invention is not limited thereto. In other embodiments, an included angle defined by the opening direction of each of the fifth concave parts 308a and the first direction 109a, and an included angle defined by the opening direction of each of the sixth concave parts 308b and the second direction 109b could be any angle that is larger than 0 degree and smaller than 180 degrees. The fifth finger-shaped electrode 310 includes a plurality of fifth extension parts 310b disposed in the fifth concave parts 308a respectively. The sixth finger-shaped electrode 312 includes a plurality of sixth extension parts 312b disposed in the sixth concave parts 308b respectively. In addition, the fifth finger-shaped electrode 310 further includes a fifth base 310a. The fifth extension parts 310b connect to the fifth base 310a. The sixth finger-shaped electrode 312 further includes a sixth base 312a. The sixth extension parts 312b connect to the sixth base 312a. In one embodiment, a material of the third metal layer 302 includes, for instance, copper or aluminum.

Herein, the first zigzaging electrode 108 is electrically connected to the third finger-shaped electrode 210 and the fourth finger-shaped electrode 212. Other than electrically connecting to the first finger-shaped electrode 110 and the second finger-shaped electrode 112, the second zigzaging electrode 208 is also electrically connected to the fifth finger-shaped electrode 310 and the sixth finger-shaped electrode 312. The third zigzaging electrode 308 is electrically connected to the third finger-shaped electrode 210 and the fourth finger-shaped electrode 212.

In the present embodiment, only the disposition and the connection between the first metal layer 102 and the second metal layer 202 are described for better illustration. Those skilled in the art should understand that the disposition and the connection of the third metal layer 302 can be referred to those of the first metal layer 102 and the second metal layer 202 so as to be adjusted according to the needs in design. In other embodiments, the capacitor structure of the invention can have only two layers of metal layers or more than three layers of metal layers.

Referring to FIG. 1A and FIG. 1B again, the capacitor structure further includes a plurality of vias 114 disposed between the first metal layer 102 and the second metal layer 202. With such disposition, the first zigzaging electrode 108 is electrically connected to the third finger-shaped electrode 210 and the fourth finger-shaped electrode 212 through the vias 114. The second zigzaging electrode 208 can also be electrically connected to the first finger-shaped electrode 110 and the second finger-shaped electrode 112 through the vias 114. Here, a material of the vias 114 includes copper or aluminum, for instance.

In the present embodiment, the vias 114 are disposed, for example, corresponding to positions of two ends of the first zigzaging electrode 108 and the second zigzaging electrode 208. Accordingly, the first zigzaging electrode 108 can be electrically connected to the third base 210a and the fourth base 212a through the vias 114. The second zigzaging electrode 208 can be electrically connected to the first base 110a and the second base 112a through the vias 114. Nevertheless, the disposition of the vias 114 is not limited to those positions. The vias 114 can also have other dispositions. Another embodiment is illustrated in the following.

Figure 2:
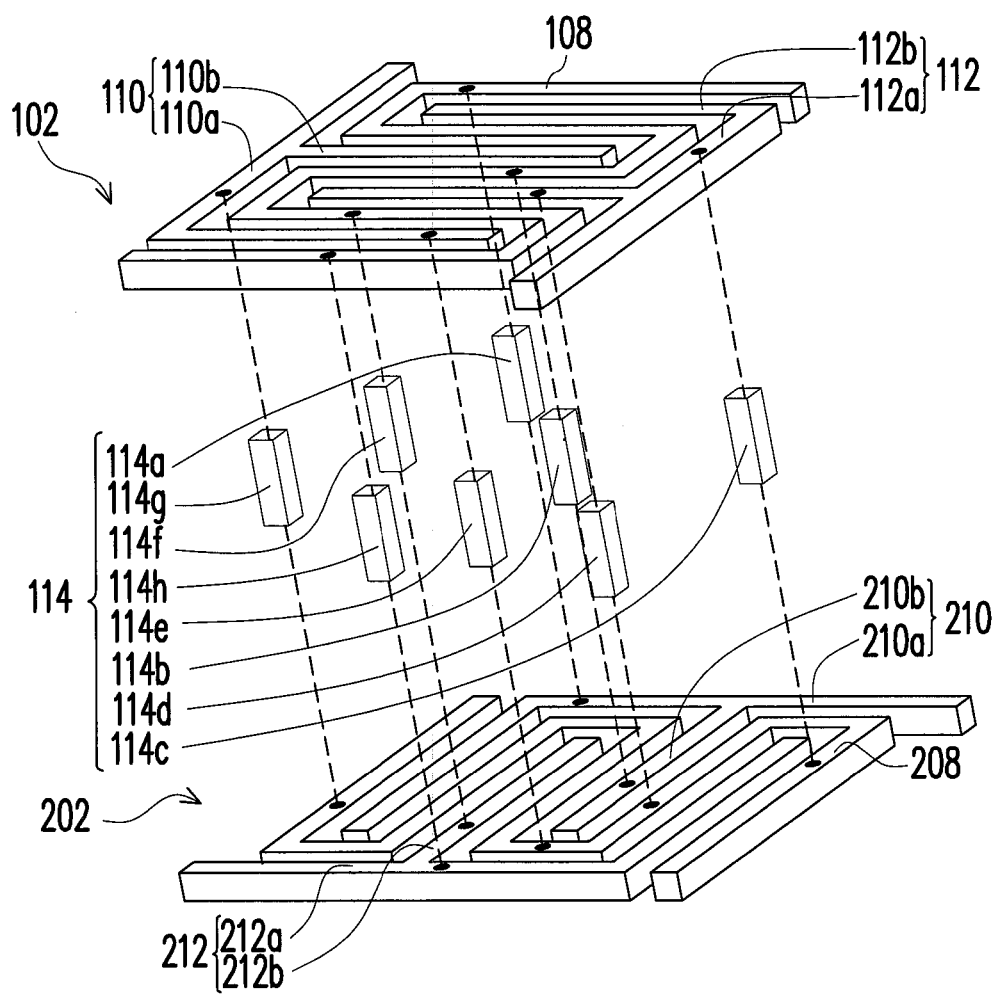
FIG. 2 is a schematic diagram showing various modes of a plurality of vias connecting two adjacent metal layers in a capacitor structure illustrated according to one embodiment of the invention.

FIG. 2 is a schematic diagram depicting various modes of a plurality of vias connecting two adjacent metal layers in a capacitor structure illustrated according to one embodiment of the invention. Here, the first metal layer 102 and the second metal layer 202 in FIG. 1A are used as an example for illustration. In the following, various modes of a plurality of vias connecting two adjacent metal layers are depicted with the accompanying FIG. 2.

Referring to FIG. 2, in the present embodiment, a plurality of vias 114 are disposed between the first metal layer 102 and the second metal layer 202. With respect to the first zigzaging electrode 108, a via 114a and a via 114h are disposed at two ends of the first zigzaging electrode 108 respectively. A via 114b and a via 114f are disposed between the two ends of the first zigzaging electrode 108 respectively. With respect to the second zigzaging electrode 208, a via 114c and a via 114g are disposed at two ends of the second zigzaging electrode 208 respectively. A via 114d and a via 114e are disposed between the two ends of the second zigzaging electrode 208 respectively.

According to the disposition aforementioned, the first zigzaging electrode 108 is electrically connected to the third finger-shaped electrode 210 and the fourth finger-shaped electrode 212. The second zigzaging electrode 208 is electrically connected to the first finger-shaped electrode 110 and the second finger-shaped electrode 112. It should be noted that the first zigzaging electrode 108 can be electrically connected to the third base 210a or the third extension parts 210b, and can be electrically connected to the fourth base 212a or the fourth extension parts 212b by disposing the vias 114 at different positions. In addition, the second zigzaging electrode 208 can be electrically connected to the first base 110a or the first extension parts 110b, and can be electrically connected to the second base 112a or the second extension parts 112b by disposing the vias 114 at different positions. Taking the plurality of vias 114 in FIG. 2 as an example, the via 114a can connect the first zigzaging electrode 108 in the first metal layer 102 to the third base 210a of the third finger-shaped electrode 210 in the second metal layer 202; the via 114b connects the first zigzaging electrode 108 in the first metal layer 102 to the third extensions parts 210b of the third finger-shaped electrode 210 in the second metal layer 202; the via 114d connects the second zigzaging electrode 208 in the second metal layer 202 to the second extension parts 112b of the second finger-shaped electrode 112 in the first metal layer 102; the via 114c connects the second zigzaging electrode 208 in the second metal layer 202 to the second base 112a of the second finger-shaped electrode 112 in the first metal layer 102; the via 114e connects the second zigzaging electrode 208 in the second metal layer 202 to the first extension parts 110b of the first finger-shaped electrode 110 in the first metal layer 102; the via 114f connects the first zigzaging electrode 108 in the first metal layer 102 to the fourth extension parts 212b of the fourth finger-shaped electrode 212 in the second metal layer 202; the via 114h connects the first zigzaging electrode 108 in the first metal layer 102 to the fourth base 212a of the fourth finger-shaped electrode 212 in the second metal layer 202; the via 114g connects the second zigzaging electrode 208 in the second metal layer 202 to the first base 110a of the first finger-shaped electrode 110 in the first metal layer 102.

Moreover, the manner of the vias 114 connecting to the first metal layer 102 and the second metal layer 202 is not limited and is acceptable as long as the first zigzaging electrode 108 can be electrically connected to the third finger-shaped electrode 210 and the fourth finger-shaped electrode 212, and the second zigzaging electrode 208 can be electrically connected to the first finger-shaped electrode 110 and the second finger-shaped electrode 112.

Accordingly, when connecting the first metal layer 102 and the second metal layer 202 using the vias 114, the first zigzaging electrode 108 in the first metal layer 102 can be connected to the third base 210a and/or at least one of the third extension parts 210b of the third finger-shaped electrode 210 in the second metal layer 202 optionally, and connected to the fourth base 212a and/or at least one of the fourth extension parts 212b of the fourth finger-shaped electrode 212 in the second metal layer 202 optionally. Similarly, the second zigzaging electrode 208 in the second metal layer 202 can be connected to the first base 110a and/or at least one of first extension parts 110b of the first finger-shaped electrode 110 in the first metal layer 102 optionally, and connected to the second base 112a and/or at least one of the second extension parts 112b of the second finger-shaped electrode 112 optionally.

Further, those skilled in the art should be able to choose and combine the dispositions of the vias 114a-114h to complete the capacitor structure in the invention. It should be noted that when the vias 114 are disposed between the two ends of the first zigzaging electrode 108 and between the two ends of the second zigzagging electrode 208 respectively (i.e. the via 114b, the via 114d, the via 114e, and the via 114f), the resistance of the electrodes in the capacitor structure having multiple metal layers can be reduced, thereby further optimizing the capacitor structure.

Figure 3A:
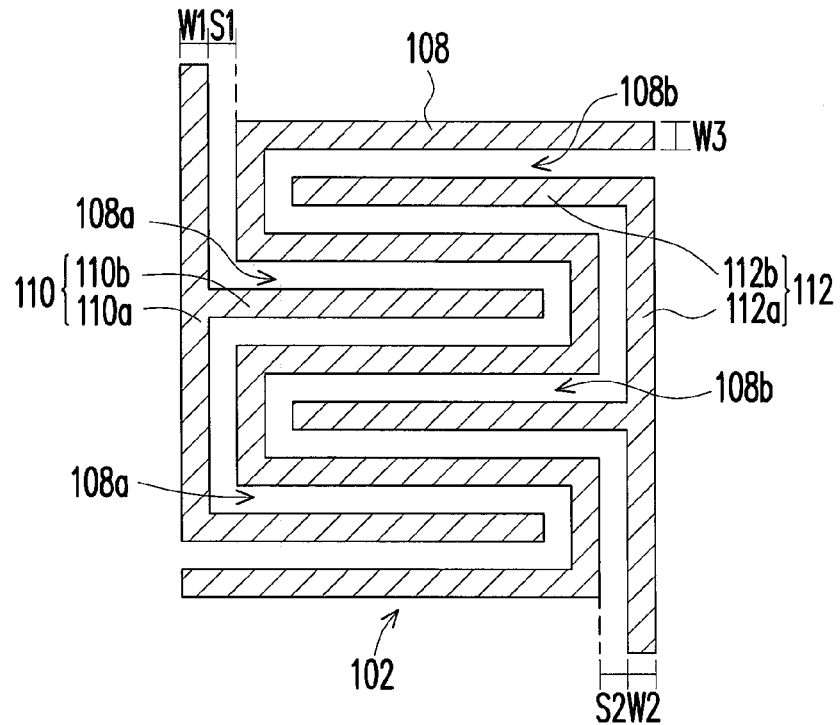
FIGS. 3A and 3B depict top views of a first metal layer 102 and a second metal layer in the capacitor structure shown in FIG. 1A respectively.
Figure 3B:
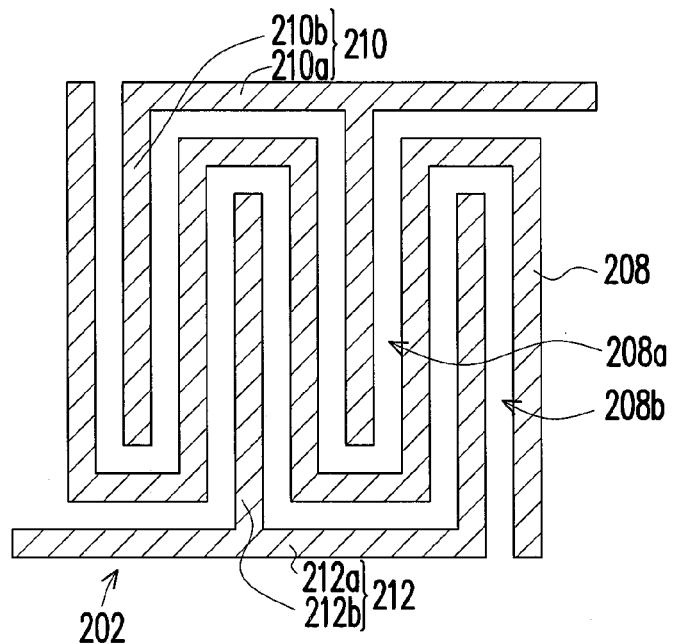

FIGS. 3A and 3B depict top views of the first metal layer 102 and the second metal layer 202 in the capacitor structure 100 shown in FIG. 1A respectively. The capacitor structure of the present embodiment is further illustrated with the accompanying FIG. 3A and FIG. 3B.

Referring to FIG. 3A, in the first metal layer 102, a first spacing S1 exists between the first zigzaging electrode 108 and the first finger-shaped electrode 110, and a second spacing S2 exists between the first zigzaging electrode 108 and the second finger-shaped electrode 112. The first spacing S1 and the second spacing S2 are substantially identical, for example; however, the invention is not limited thereto. The first spacing S1 and the second spacing S2 can be the smallest spacing achievable by the semiconductor fabrication techniques. The first spacing S1 and the second spacing S2 can respectively range from 0.14 micrometer (μm) to 0.21 μm.

Either a line width W1 of the first finger-shaped electrode 110, or a line width W2 of the second finger-shaped electrode 112, or a line width W3 of the zigzaging electrode 108 is smaller or equal to the first spacing S1 and the second spacing S2. The line width W1 of the first finger-shaped electrode 110, the line width W2 of the second finger-shaped electrode 112, and the line width W3 of the first zigzaging electrode 108 can range from 0.14 μm to 0.20 μm respectively. The line width W1, the line width W2, and the line width W3 are substantially identical, for instance. In the second metal layer 202 and the third metal layer 302, the sizes and the relative relations between the spacings and the line widths can be referred to the first metal layer 102.

Next, referring to FIGS. 3A and 3B simultaneously, a top view pattern of the first metal layer 102 substantially overlaps with a top view pattern of the second metal layer 202 after rotating an angle. In the present embodiment, the angle is substantially equal to 90 degrees, for instance; however, the invention is not limited thereto. In other embodiments, the angle can be any angle that is larger than 0 degree and smaller than 180 degrees.

Accordingly, in the capacitor structure 100 of the present embodiment, since the first zigzaging electrode 108 is electrically connected to the third finger-shaped electrode 210 and the fourth finger-shaped electrode 212, and the second zigzaging electrode 208 is electrically connected to the first finger-shaped electrode 110 and the second finger-shaped electrode 112, potential differences are then present between the first zigzaging electrode 108 and the first finger-shaped electrode 110, between the first zigzaging electrode 108 and the second finger-shaped electrode 112, between the second zigzaging electrode 208 and the third finger-shaped electrode 210, and between the second zigzaging electrode 208 and the fourth finger-shaped electrode 212 so as to result in capacitance respectively. Moreover, a parasitic capacitance generated between adjacent metal layers is also present between the first metal layer 102 and the second metal layer 202. Consequently, the surface area of the electrodes and the total capacitance of the invention are increased significantly comparing to those of the conventional flat capacitor structures. Furthermore, the total capacitance can be optimized by adjusting the spacings between the zigzaging electrodes and the finger-shaped electrodes in the metal layers to be the same. Thus, the capacitance in a unit area can be increased by using the capacitor structure of the invention, and a lower area cost can be achieved in terms of the layout of the integrated circuit.

Figure 4:
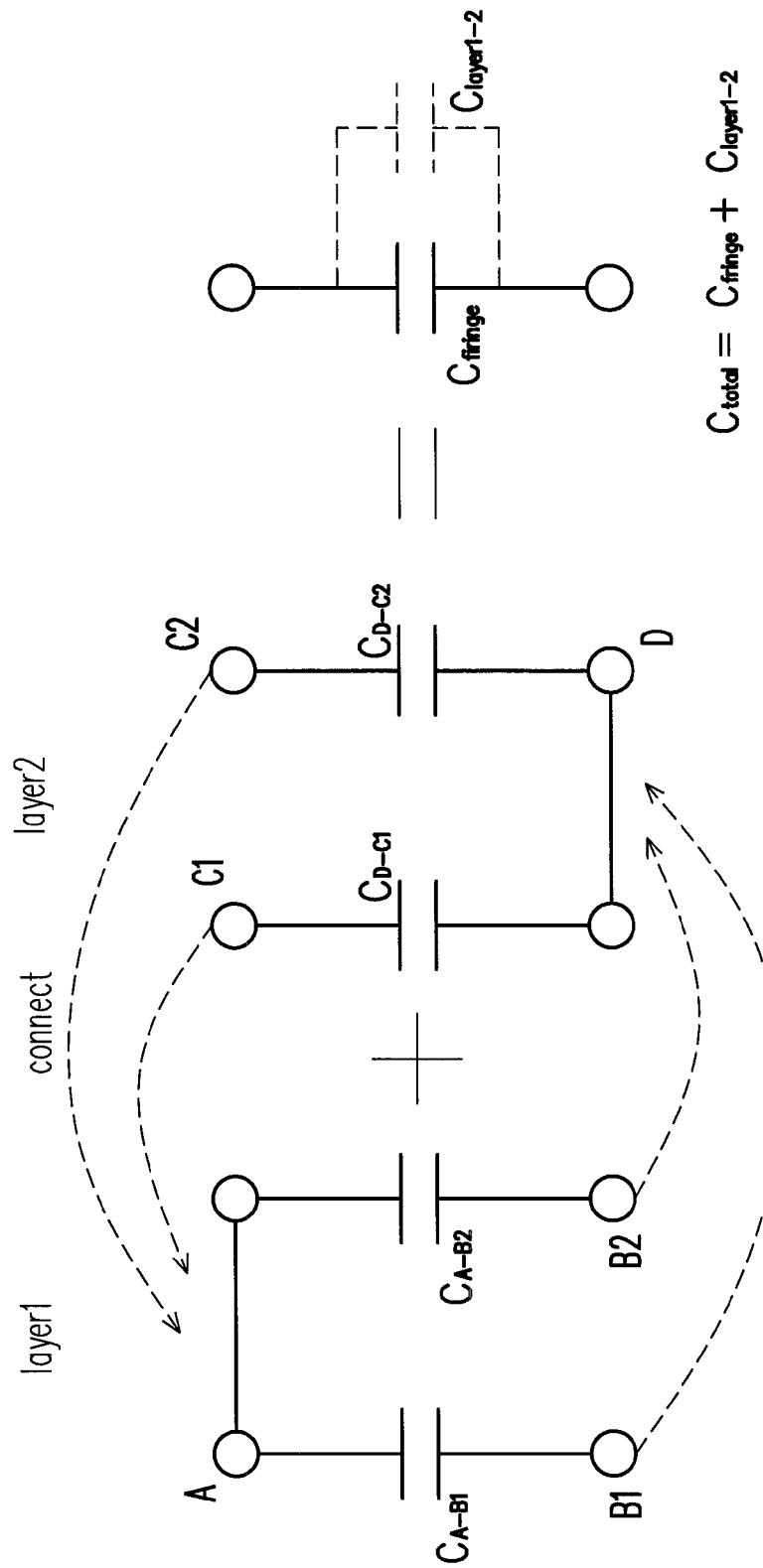
FIG. 4 is a schematic diagram of a formula used to calculate a total capacitance of the capacitor structure in the invention.

FIG. 4 is a schematic diagram of a formula used to calculate the total capacitance of the capacitor structure in the invention. Here, a capacitor structure having two layers of metal layers (i.e. the first metal layer 102 and the second metal layer 202) is adopted as an example for illustration.

Referring to FIG. 4, "A" represents the first zigzaging electrode 108; "B1" represents the first finger-shaped electrode 110; "B2" represents the second finger-shaped electrode 112; "D" represents the second zigzaging electrode 208; "C1" represents the third finger-shaped electrode 210; and "C2" represents the fourth finger-shaped electrode 212. "$C_{A-B1}$" represents a capacitance between the first zigzaging electrode 108 and the first finger-shaped electrode 110; "$C_{A-B2}$" represents a capacitance between the first zigzaging electrode 108 and the second finger-shaped electrode 112; "$C_{D-C1}$" represents a capacitance between the second zigzaging electrode 208 and the third finger-shaped electrode 210; "$C_{D-C2}$" represents a capacitance between the second zigzaging electrode 208 and the fourth finger-shaped electrode 212; and "$C_{fringe}$" represents a total sum of the capacitance generated between the zigzaging electrodes and the finger-shaped electrodes in the same layer of all the metal layers. Moreover, "layer 1" represents the first metal layer 102; "layer 2" represents the second metal layer 202; and "$C_{layer1-2}$" represents a parasitic capacitance generated between the first metal layer 102 and the second metal layer 202; and "$C_{total}$" represents a total capacitance of an entire capacitor structure. Referring to FIG. 4:

Assume $C_{A-B1}$, $C_{A-B2}$, $C_{D-C1}$, $C_{D-C2}$ are all of the same value and equal to a capacitance $C_x$; that is:

$$C_{A-B1}=C_{A-B2}=C_{D-C1}=C_{D-C2}=C_x,$$

thus $C_{fringe}$ approximately equals to 4 $C_x$, and the total capacitance $C_{total}=4\ C_x+C_{layer1-2}$.

In one embodiment, the capacitor structure of the invention has two layers of metal layers (i.e. the first metal layer 102 and the second metal layer 202), and a line width of the two finger-shaped electrodes in each of the metal layers (i.e. the first line width W1 and the second line width W2 in FIG. 3A) and a line width of the zigzaging electrode (i.e. the third line width W3 in FIG. 3A) are all 0.14 μm, and the spacings between the finger-shaped electrodes and the zigzaging electrodes in each of the metal layers (i.e. the first spacing S1 and the second spacing S2 in FIG. 3A) are also 0.14 μm. The two finger-shaped electrodes in each of the metal layers have four extension parts respectively. Under this condition for fabrication, the total capacitance of the capacitor structure in the invention calculated from the formula above-mentioned is 235 pico-faraday (pf) per unit area. Under the same condition for fabrication (e.g. the same line width and the same spacing), the total capacitance of the conventional finger-shaped capacitor structure is about 220 pf per unit area. Accordingly, the total capacitance of the capacitor structure in the invention is at least 5% higher than that of the finger-shaped capacitor structure in the conventional technique.

In summary, in the capacitor structure provided in the above embodiments, the total capacitance is increased by increasing the surface area of the electrodes. Moreover, the spacings between the electrodes in each of the metal layers are adjusted to the same to further optimize the total capacitance. Therefore, the capacitance in a unit area can be increased by using the capacitor structure of the invention, and a lower area cost can be achieved in terms of the layout of the integrated circuit.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A capacitor structure, comprising:
   a dielectric material layer; and
   at least two metal layers disposed at intervals in the dielectric material layer, and each of the metal layers comprising:
   a zigzaging electrode, forming a plurality of first concave parts and a plurality of second concave parts, the plurality of first concave parts being disposed at one side of the zigzaging electrode and the plurality of second concave parts being disposed at the other side of the zigzaging electrode;

a first finger-shaped electrode comprising a plurality of first extension parts disposed in the plurality of first concave parts respectively; and a second finger-shaped electrode comprising a plurality of second extension parts disposed in the plurality of second concave parts respectively, wherein the zigzaging electrode in each of the metal layers is electrically connected to the first finger-shaped electrode in an adjacent metal layer and the second finger-shaped electrode in the adjacent metal layer.

2. The capacitor structure as claimed in claim 1, wherein a top view pattern of each of the metal layers substantially overlaps with a top view pattern of the adjacent metal layer after rotating an angle.

3. The capacitor structure as claimed in claim 2, wherein the angle is substantially equal to 90 degrees.

4. The capacitor structure as claimed in claim 1, further comprising a plurality of vias configured to electrically connect the zigzaging electrode in each of the metal layers to the first finger-shaped electrode in the adjacent metal layer and the second finger-shaped electrode in the adjacent metal layer.

5. The capacitor structure as claimed in claim 4, wherein the zigzaging electrode in each of the metal layers is electrically connected to at least one of the plurality of first extension parts of the first finger-shaped electrode in the adjacent metal layer and at least one of the plurality of second extension parts of the second finger-shaped electrode in the adjacent metal layer through the plurality of vias.

6. The capacitor structure as claimed in claim 4, wherein the first finger-shaped electrode further comprises a first base connected to the plurality of first extension parts, and the second finger-shaped electrode further comprises a second base connected to the plurality of second extension parts.

7. The capacitor structure as claimed in claim 6, wherein the zigzaging electrode in each of the metal layers is electrically connected to the first base of the first finger-shaped electrode in the adjacent metal layer and the second base of the second finger-shaped electrode in the adjacent metal layer through the plurality of vias.

8. The capacitor structure as claimed in claim 6, wherein the zigzaging electrode in each of the metal layers is electrically connected to at least one of the plurality of first extension parts of the first finger-shaped electrode in the adjacent metal layer and the second base of the second finger-shaped electrode in the adjacent metal layer through the plurality of vias, and/or electrically connected to the first base of the first finger-shaped electrode in the adjacent metal layer and at least one of the plurality of second extension parts of the second finger-shaped electrode in the adjacent metal layer through the plurality of vias.

9. The capacitor structure as claimed in claim 1, wherein in each of the metal layers, a first spacing exists between the first finger-shaped electrode and the zigzaging electrode, and a second spacing exists between the second finger-shaped electrode and the zigzaging electrode.

10. The capacitor structure as claimed in claim 9, wherein the first spacing and the second spacing are substantially identical.

11. The capacitor structure as claimed in claim 9, wherein the first spacing and the second spacing range from 0.14 μm to 0.21 μm respectively.

12. The capacitor structure as claimed in claim 9, wherein a line width of the zigzaging electrode in each of the metal layers, a line width of the first finger-shaped electrode in each of the metal layers, and a line width of the second finger-shaped electrode in each of the metal layers are each smaller or equal to the first spacing and the second spacing.

13. The capacitor structure as claimed in claim 1, wherein a line width of the zigzaging electrode in each of the metal layers, a line width of the first finger-shaped electrode in each of the metal layers, and a line width of the second finger-shaped electrode in each of the metal layers range from 0.14 μm to 0.20 μm respectively.

14. A capacitor structure, comprising:
a dielectric material layer;
a first metal layer disposed in the dielectric material layer, the first metal layer comprising:
a first zigzaging electrode, forming a plurality of first concave parts and a plurality of second concave parts, the plurality of first concave parts being disposed at one side of the first zigzaging electrode and the plurality of second concave parts being disposed at the other side of the first zigzaging electrode;
a first finger-shaped electrode comprising a plurality of first extension parts disposed in the plurality of first concave parts respectively;
a second finger-shaped electrode comprising a plurality of second extension parts disposed in the plurality of second concave parts respectively; and
a second metal layer disposed at intervals with the first metal layer in the dielectric material layer, the second metal layer comprising:
a second zigzaging electrode, forming a plurality of third concave parts and a plurality of fourth concave parts, the plurality of third concave parts being disposed at one side of the second zigzaging electrode and the plurality of fourth concave parts being disposed at the other side of the second zigzaging electrode;
a third finger-shaped electrode comprising a plurality of third extension parts disposed in the plurality of third concave parts respectively; and
a fourth finger-shaped electrode comprising a plurality of fourth extension parts disposed in the plurality of fourth concave parts respectively,
wherein the first zigzaging electrode is electrically connected to the third finger-shaped electrode and the fourth finger-shaped electrode, and the second zigzaging electrode is electrically connected to the first finger-shaped electrode and the second finger-shaped electrode.

15. The capacitor structure as claimed in claim 14, wherein a top view pattern of the first metal layer substantially overlaps with a top view pattern of the second metal layer after rotating an angle.

16. The capacitor structure as claimed in claim 14, further comprising a plurality of vias configured to electrically connect the first zigzaging electrode to the third finger-shaped electrode and the fourth finger-shaped electrode, and configured to electrically connect the second zigzaging electrode to the first finger-shaped electrode and the second finger-shaped electrode.

17. The capacitor structure as claimed in claim 16, wherein the first zigzaging electrode is electrically connect to at least one of the plurality of third extension parts and at least one of the plurality of fourth extension parts through the plurality of vias.

18. The capacitor structure as claimed in claim 16, wherein the first finger-shaped electrode further comprises a first base connected to the plurality of first extension parts, the second finger-shaped electrode further comprises a second base connected to the plurality of second extension parts, the third finger-shaped electrode further comprises a third base connected to the plurality of third extension parts, and the fourth finger-shaped electrode further comprises a fourth base connected to the plurality of fourth extension parts.

19. The capacitor structure as claimed in claim 18, wherein the first zigzaging electrode is electrically connected to the third base and the fourth base through the plurality of vias.

20. The capacitor structure as claimed in claim 18, wherein the first zigzaging electrode is electrically connected to at least one of the plurality of third extension parts and the fourth base through the plurality of vias, and/or electrically connected to the third base and at least one of the plurality of fourth extension parts through the plurality of vias.

* * * * *